United States Patent [19]

Zajac

[11] Patent Number: 4,845,053
[45] Date of Patent: Jul. 4, 1989

[54] FLAME ASHING PROCESS FOR STRIPPING PHOTORESIST

[76] Inventor: John Zajac, 1137 Angmar Ct., San Jose, Calif. 95121

[21] Appl. No.: 147,884

[22] Filed: Jan. 25, 1988

[51] Int. Cl.⁴ .................... H01L 21/47; H01L 21/312
[52] U.S. Cl. ................................... 437/229; 427/224; 427/271; 148/DIG. 137; 437/247
[58] Field of Search ................. 437/229; 427/58, 224, 427/226, 264, 270, 271, 223

[56] References Cited

U.S. PATENT DOCUMENTS

| | | | |
|---|---|---|---|
| 4,241,165 | 12/1980 | Hughes et al. | 430/269 |
| 4,296,146 | 10/1981 | Penn | 427/58 |
| 4,341,592 | 8/1982 | Shortes et al. | 156/643 |
| 4,374,699 | 2/1983 | Sanders et al. | 156/643 |
| 4,631,250 | 12/1986 | Hayashi | 430/329 |

Primary Examiner—Brian E. Hearn
Assistant Examiner—Beverly A. Pawlikowski
Attorney, Agent, or Firm—Flehr, Hohbach, Test, Albritton & Herbert

[57] ABSTRACT

Process and apparatus employing flame ashing for stripping photoresist from a substrate in the manufacture of a semiconductor device. The substrate is exposed to the flame with the photoresist to be removed being contacted directly by the flame to oxidize, or ash, the photoresist. The flame is produced by burning oxygen and a gaseous fuel, and the rate of ashing is increased by preheating the substrate. Nitrogen, a nitrogen-containing gas or an inert gas is added to the fuel to provide a cooler flame and an improved ashing rate. In one disclosed embodiment, the oxygen and the gaseous fuel are discharged through a plurality of spaced apart openings in a burner and the substrate is moved relative to the frames to successively ash different portions of the photoresist.

18 Claims, 1 Drawing Sheet

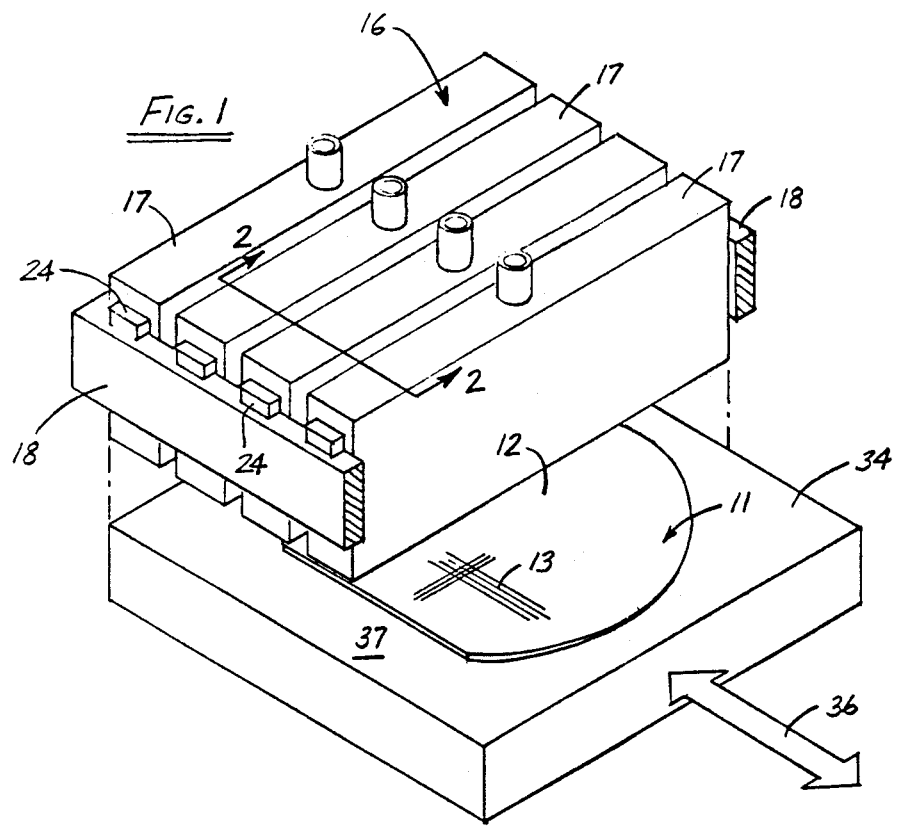
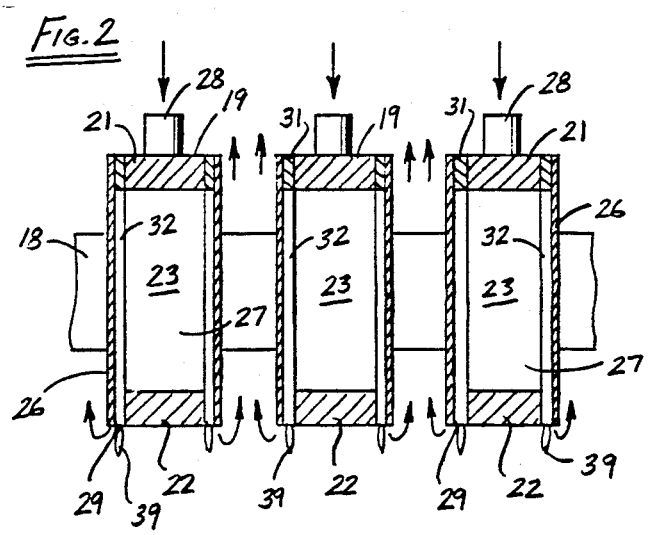

FLAME ASHING PROCESS FOR STRIPPING PHOTORESIST

This invention pertains generally to the manufacture of semiconductor devices, and more particularly to a process and apparatus for removing photoresist from a substrate in the manufacture of a semiconductor device.

In the manufacture of semiconductor devices, photoresist masks are employed to protect areas which are not to be treated in a particular processing step such as etching or implantation. After the processing step is completed, the photoresist is removed, and the next step in the manufacturing process is performed. For a given device, it may be necessary to apply and remove photoresist for as many as 50 or more different processing steps, and it is important that all of the photoresist be completely removed after each step to avoid contamination.

Originally, photoresist was removed chemically, but this method is no longer in wide use due to environmental problems and the relative high cost of the chemicals.

Today photoresist is most commonly stripped in plasma reactors which employ an RF discharge to produce oxygen radicals which combine with the hydrocarbons of the photoresist to produce water and carbon dioxide which are in gaseous form and are easily pumped away. Plasma systems are relatively expensive and delicate instruments, and they frequently require maintenance. To increase the throughput of the reactors, small amounts of a gas containing fluorine or chlorine are added to the oxygen which forms the plasma. While the fluorine or chlorine improves the photoresist removal, it also causes other materials to be removed, including those which were protected by the photoresist as well as those which were not. This is a particularly serious problem with gate oxide films and other materials where film thickness is critical. As film thickness decreases, the ability to withstand electrical charge also decreases, and many devices are destroyed by the charge present in the RF fields of plasma systems.

It is in general an object of the invention to provide a new and improved process and apparatus for removing organic photoresist from a substrate in the manufacture of semiconductor devices.

Another object of the invention is to provide a process and apparatus of the above character which overcome the limitations and disadvantages of the techniques heretofore employed in stripping photoresist.

These and other objects are achieved in accordance with the invention by exposing a semiconductor substrate to a flame with the photoresist to be removed being contacted directly by the flame to oxidize, or ash, the photoresist. The flame is produced by burning oxygen and a gaseous fuel, and the rate of ashing is increased by preheating the substrate. Nitrogen, a nitrogen-containing gas or an inert gas is added to the fuel to provide a cooler flame and an improved ashing rate. In one disclosed embodiment, the oxygen and the gaseous fuel are discharged through a plurality of elongated slotted openings in a generally planar burner to produce a plurality of elongated parallel flames, and the substrate is moved through the flames in a direction generally perpendicular to the flames to successively ash different portions of the photoresist.

FIG. 1 is an exploded isometric view, partly broken away, of one embodiment of apparatus for stripping photoresist in accordance with the invention.

FIG. 2 is an enlarged fragmentary sectional view taken along line 2—2 in FIG. 1.

In the drawings, the invention is illustrated in connection with a semiconductor wafer 11 comprising a substrate 12 on which a plurality of semiconductor devices are being formed. A mask 13 of organic photoresist material still covers portions of the substrate which were protected in a step of the manufacturing process which has now been completed. This photoresist is to be removed.

The ashing apparatus includes a generally rectangular flame head 16 which has a plurality of burners 17 mounted in a peripheral supporting frame 18. Each of the burners has a rigid rectangular frame 19 having a top member 21, a bottom member 22 and end members 23. The burners are retained in the peripheral frame by lugs 24 which project from the end members of the burners and rest upon the peripheral frame.

Side plates 26 are mounted on frames 19 to form chambers 27. Reagent gases are supplied to the chambers through inlet fittings 28 on the top members of the frames and discharged from the chambers through elongated discharge openings 29 formed between the side plates and the bottom members of the frames. Each of these openings has a length slightly greater than the diameter of the wafer and a width on the order of 0.005–0.050 inch. Each opening might, for example, have a length on the order of 6 inches and a width on the order of 0.010 inch. The burners are positioned in the frame so that the discharge openings are spaced uniformly apart and generally parallel to each other, with a spacing on the order of $\frac{3}{8}$ inch between the openings.

In the embodiment illustrated, spacers 31, 32 are positioned between the side plates 26 and the top and end members of the burner frames. No spacers are employed between the side plates and the bottom frame members, where the discharge openings 29 are formed. The width of the discharge openings is thus determined by the thickness of the spacers.

The burners in the flame head are spaced apart to provide passageways 33 between the burners through which exhaust gases can pass following combustion in front of, or below, the burners.

A heated wafer carrier 34 is positioned beneath the flame head or burners for movement in a direction generally parallel to the bottom of the burner head and perpendicular to the length of the slotted discharge openings, as indicated by arrow 36. The carrier has a generally planar upper surface 37 which is spaced on the order of 0.050–0.250 inch from the lower surfaces of the burner head. The wafer rests on the upper surface of the carrier, with the back side of the wafer, i.e. the side opposite the photoresist, in thermal contact with the surface. The carrier comprises a platen of thermally conductive material, such as metal or graphite, and includes suitable means such as electrically energized heating elements (not shown) for heating the platen. An air cooling system (not shown) is provided for cooling the platen and thereby further controlling the temperature of the platen. The platen has a relatively large thermal mass, and it also serves as a heat sink to maintain the substrate at a substantially uniform temperature throughout. As discussed more fully hereinafter, the plate is advantageously maintained at a temperature on the order of 100–200 degrees C., with a preferred temperature of 150 degrees C., to preheat the substrate. The carrier can also be heated by other suitable means such as a radiant heat source on the back side of the platen.

In some applications, such as aluminum coated wafers, to avoid damage to the substrate and the devices formed thereon, it is important that the substrate not be heated to a temperature greater than about 450 degrees C. even though the substrate is in direct contact with the flames produced by the burner. By moving the substrate so that different portions of the photoresist are successively in contact with the flames, the maximum temperature of the substrate can be kept to about 400 degrees C. even when the substrate is preheated to a temperature on the order of 100–200 degrees C. by the heated carrier.

Gaseous fuel and oxygen are supplied to the burner for combustion to form a plurality of elongated, spaced apart flames 39 in front of, or below, the discharge openings. Suitable gases include hydrogen, propane, methane, acetylene, MAPP gas, and combinations thereof. Hydrogen is particularly preferred as a fuel since it contains no carbon to form a residue on the wafers. Nitrogen, a gas containing nitrogen, or an inert gas is added to the fuel to help cool the flame and prevent overheating of the substrate. Good results are obtained, for example, with a gas containing on the order of 13–22% hydrogen and 78–87% nitrogen, with enough oxygen for complete combustion. A typical gas flow for a 6 by 7 inch burner with discharge openings spaced ⅜ inch apart is 150 liters per minute of fuel (16% hydrogen and 84% nitrogen) and 11 liters of oxygen per minute. The oxygen can be either pure oxygen, a gas which contains oxygen, or a combination of such gases.

The rate at which the photoresist is removed, i.e. the stripping rate, is to some extent dependent upon the amount of oxygen burned with the gaseous fuel, with the stripping rate increasing as the oxygen content is increased, up to the maximum combustion limit (pop out). Good results have been obtained when the ratio of fuel to oxygen is on the order of 2:1. A mixture of 3000 cc oxygen and 6000 cc fuel, for example, can produce a stripping rate as much as five times faster than the same mixture with only 1000 cc oxygen.

As discussed above, the presence of nitrogen or an inert gas in the fuel has been found to help cool the flame and prevent overheating of the substrate. The nitrogen or inert gas also tends to reduce the rate of radical recombination so that more reactants are available for ashing. Thus, the nitrogen or inert gas provides a cooler flame and an improved ashing rate. The best results are obtained when the nitrogen flow is approximately equal to ten times the oxygen flow, although the exact ratio is not critical. A mixture of 200 cc fuel with 1500 cc nitrogen and 100 cc oxygen gives an ashing rate about twice as great as a mixture with 200 cc fuel, 1000 cc oxygen, and no nitrogen.

It has also been found that preheating the substrate to a temperature on the order of 100–200 degrees C. can be effective in preventing substrate breakage due to thermal stress, as well as increasing the stripping rate. Preheating to 200 degrees C. produces a stripping rate about 3 times the rate at 100 degrees C., and preheating to 400 degrees C. produces an additional improvement of about 20 percent. However, in order to avoid overheating of the substrate, preheating temperatures greater than about 200 degrees C. should not be employed unless some means is provided to prevent the substrate temperature from exceeding about 450 degrees C. during ashing. As noted above, a preferred preheating temperature is on the order of 150 degrees C.

The substrate is positioned so that it is in the flames, with the flames in direct contact with the portions of the photoresist to be removed. It has been found that the position of the substrate within the flames can affect the stripping rate and that the stripping rate can be as much as five times faster when the substrate is within the flames rather than at the tips. Placing the substrate too close to the discharge openings or nozzles can, however, prevent stripping.

It is important to ensure that all hydrocarbons are removed during the ashing process. Incomplete combustion within the flame can cause some of the reactants to be absorbed on the surface of the substrate. These few monolayers can be removed by moving the flame away from the substrate to allow all of the hydrocarbons to be fully reacted or, more desirably, by burning a fuel which contains no carbon to produce the last flame to which the substrate is exposed. Suitable fuels for this purpose include hydrogen and nitrous oxide.

The stripping process is carried out with the apparatus shown in the drawing by burning a gaseous fuel with oxygen to produce the elongated flames 39. Any of the fuel mixtures and flow rates discussed above can be used in this process. The substrate is placed on carrier plate 34 with the photoresist on the upper surface of the substrate in direct contact with the flames. The reactions which take place in the flames are complex and are not fully understood. However, the end result is that oxygen and/or hydrogen from the combustion process combines with the hydrocarbons of the photoresist to produce water and carbon dioxide in gaseous form.

The substrate is preheated to a temperature on the order of 100–200 degrees C., and preferably 150 degrees C. by the heated carrier platen, and movement of the plate beneath the burner helps to keep the substrate from being overheated by the flames.

Each of the flames oxidizes, or ashes, a strip-like area of photoresist on the order of ⅛ inch wide. With the flames spaced about ⅜ inch apart and the wafer moving through the flames at a rate of about ¾ inch per minute, the wafer is fully stripped of photoresist in about 30 seconds.

Rather than moving the carrier to effect movement of the substrate through the flames, the burner can be moved either alone or in combination with the carrier to achieve the same result. Accordingly, the term "moving the substrate relative to the flames" is used broadly to include moving either the substrate or the flames, or both.

Although in the embodiment shown in the drawings the burners have elongated slotted openings and movement of the substrate is in a direction generally perpendicular to the openings, it will be understood that other opening arrangements and substrate movements can be employed, if desired. For example, the discharge openings can be shorter staggered openings, and the movement of the substrate can be at an angle of 45 degrees relative to the openings or in any other direction which provides complete coverage of the photoresist to be removed.

The ashing process and apparatus have a number of important features and advantages. They are simpler and more reliable than a plasma reactor since they do not require elements such as flow controllers, vacuum pumps, RF generators, matching networks, a vacuum system and valves. They are also less expensive, and there is no danger of electrical damage to the delicate devices being formed since there is no electrical discharge. There are no corrosive gases, such as fluorine or chlorine, to attack the underlying materials (e.g., silicon, silicon dioxide, silicon nitride, etc.) on the substrate. There is also less particulate contamination since the process is carried out at atmospheric pressure, with no vacuum pumpdown or venting to create attract particulate contamination on the substrate.

It is apparent from the foregoing that a new and improved process and apparatus for stripping photoresist have been provided. While only certain presently preferred embodiments have been described in detail, as will be apparent to those familiar with the art, certain changes and modifications can be made without departing from the scope of the invention as defined by the following claims.

I claim:

1. In a process for removing an organic photoresist from a substrate in the manufacture of a semiconductor device, the steps of: burning a gaseous fuel with oxygen and a gas selected from the group consisting of nitrogen, an inert gas and combinations thereof to produce a flame, and contacting the substrate with the flame to ash the photoresist.

2. The process of claim 1 wherein the substrate is heated to a temperature no greater than about 450 degrees C.

3. The process of claim 1 including the step of preheating the substrate to a temperature on the order of 100-200 degrees C.

4. The process of claim 3 wherein the substrate is preheated by placing it in contact with a heated body.

5. The process of claim 1 including the step of effecting relative movement between the flame and the substrate.

6. The process of claim 1 wherein the oxygen is present in a gas which contains oxygen.

7. The process of claim 6 wherein the fuel contains a gas selected from the group consisting of hydrogen, propane, methane, acetylene and MAPP gas, and combinations thereof.

8. The process of claim 1 wherein the nitrogen is present in a nitrogen-containing gas.

9. The process of claim 1 wherein the gas comprises on the order of 13-22% hydrogen and 78-87% nitrogen.

10. The process of claim 1 wherein the gaseous fuel is delivered to the flame through a elongated slotted opening, and the substrate is moved relative to the slotted opening to successively bring different portions of the photoresist into contact with the flame.

11. In a process for removing an organic photoresist from a substrate in the manufacture of a semiconductor device, the steps of: passing a gaseous fuel, oxygen and a gas selected from the group consisting of nitrogen, an inert gas and combinations thereof through an elongated slotted opening, burning the gaseous fuel, oxygen and gas selected from the group consisting of nitrogen, an inert gas and combinations thereof to produce a flame outside the slotted opening, and passing the substrate through the flame to successively bring different portions of the photoresist into contact with the flame to oxidize the successive portions and thereby remove the photoresist from the substrate.

12. The process of claim 11 including the step of placing the substrate on a heated body to heat the substrate to a temperature on the order of 100-200 degrees C.

13. The process of claim 11 wherein the substrate is heated to a temperature no greater than about 450 degrees C.

14. The process of claim 11 wherein the nitrogen is present in a nitrogen-containing gas.

15. The process of claim 11 wherein the gaseous fuel contains on the order of 13-22% hydrogen and 78-87% nitrogen.

16. In a process for removing an organic photoresist from a substrate in the manufacture of a semi-conductor device, the steps of: burning a gaseous fuel with oxygen to produce a flame, burning a gas selected from a group consisting of nitrogen, an inert gas and combinations thereof with the fuel to control the temperature of the flame, and contacting the substrate with the flame to ash the photoresist.

17. The process of claim 16 wherein the fuel contains a gas selected from a group consisting of hydrogen, propane, methane, acetylene, and MAPP gas, and combinations thereof.

18. The process of claim 16 wherein the fuel and the gas contain on the order of 13-22% hydrogen and 78-87% nitrogen.

* * * * *